United States Patent [19]

Couture et al.

[11] Patent Number: 5,415,971
[45] Date of Patent: May 16, 1995

[54] PHOTORESIST LAMINATE INCLUDING PHOTOIMAGEABLE ADHESIVE LAYER

[75] Inventors: Ron Couture; Todd R. Murphy; Toshifumi Komatsu, all of Duluth, Minn.

[73] Assignee: The Chromaline Corporation, Duluth, Minn.

[21] Appl. No.: 42,145

[22] Filed: Apr. 2, 1993

[51] Int. Cl.6 .................. G03F 7/095; G03F 7/021
[52] U.S. Cl. .................... 430/260; 430/156; 430/162; 430/175; 430/176; 430/258; 430/273; 430/287; 430/909
[58] Field of Search ............. 430/260, 271, 275, 258, 430/156, 287, 162, 176, 175, 273, 909

[56] References Cited

U.S. PATENT DOCUMENTS

| | | | |
|---|---|---|---|
| 2,811,510 | 10/1957 | Leubner et al. | 260/67.5 |
| 2,908,667 | 10/1959 | Williams | 260/79.3 |
| 2,937,085 | 5/1960 | Seven et al. | 96/33 |
| 3,143,423 | 8/1964 | Reynolds et al. | 96/91 |
| 3,853,561 | 12/1974 | Reichel et al. | 96/36.4 |
| 4,092,170 | 5/1978 | Houtermans et al. | 96/91 R |
| 4,199,358 | 4/1980 | Parsons | 430/308 |
| 4,245,027 | 1/1981 | Takeda et al. | 430/141 |
| 4,247,615 | 1/1981 | McGuckin et al. | 430/145 |
| 4,389,480 | 6/1983 | Franke et al. | 430/271 |
| 4,430,416 | 2/1984 | Goto et al. | 430/263 |
| 4,477,552 | 10/1984 | Day et al. | 430/175 |
| 4,564,580 | 1/1986 | Ichimura et al. | 430/281 |
| 4,571,374 | 2/1986 | Vikesland | 430/260 |
| 4,587,186 | 5/1986 | Nakamura et al. | 430/260 |
| 4,652,513 | 3/1987 | Pentak et al. | 430/258 |
| 4,656,114 | 4/1987 | Cederberg et al. | 430/162 |
| 4,716,096 | 12/1987 | Cooper et al. | 430/323 |
| 4,727,013 | 2/1988 | Pentak et al. | 430/320 |
| 4,762,766 | 8/1988 | Melbye | 430/260 |
| 4,764,449 | 8/1988 | VanIseghen | 430/271 |
| 4,858,394 | 8/1989 | Lalumiere et al. | 51/312 |
| 5,185,225 | 2/1993 | Kurumisawa | 430/18 |

FOREIGN PATENT DOCUMENTS

| | | |
|---|---|---|
| 0501433A1 | 9/1992 | European Pat. Off. |
| 51-6530 | 1/1976 | Japan. |
| 54-3726 | 1/1979 | Japan. |

*Primary Examiner*—Charles L. Bowers, Jr.
*Assistant Examiner*—John S. Chu
*Attorney, Agent, or Firm*—Merchant, Gould, Smith, Edell, Welter & Schmidt

[57] ABSTRACT

A photosensitive mask laminate having a photoimageable, pressure sensitive adhesive layer and a photoimageable masking layer is disclosed. The laminate also includes a support layer, and it can include a removable carrier layer and a release layer. The laminate can be imaged by selective exposure to light or other radiation, and developing the laminate produces a mask having void and mask areas. The mask can then be used to protect selected portions of a target surface during a sandblast decorative process.

19 Claims, 1 Drawing Sheet

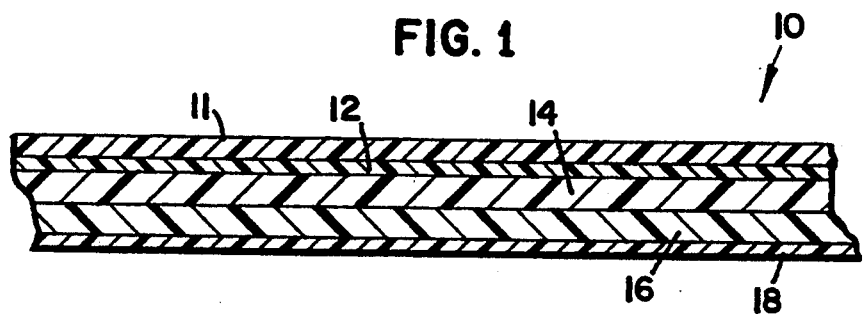
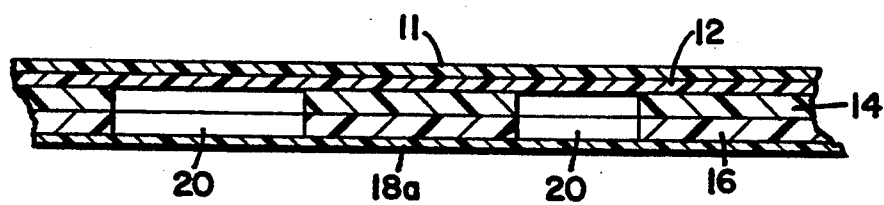

PHOTORESIST LAMINATE INCLUDING PHOTOIMAGEABLE ADHESIVE LAYER

FIELD OF THE INVENTION

The invention relates to a laminate for use in preparation of a photoresist mask for use in engraving hard abradable surfaces. More particularly, the invention relates to a mask laminate comprising a structural support layer, a photoimageable masking layer, and a photoimageable pressure sensitive adhesive layer.

BACKGROUND OF THE INVENTION

Conventional sandblast photoresists are processed into an imaged mask and then coated with a liquid adhesive composition. These imaged masks generally have mask areas and void areas which will ultimately protect and expose respectively in underlying target surface in a sandblast etching process. Conventional sandblast application operations generally attempt to apply the liquid adhesive only to the mask area which are generally raised with respect to the void areas of the photoresist. A standard application method employs a contact-type role coater which attempts to only contact the raised mask areas of the photoresist. Unfortunately, this mechanical coating does not produce adequate results. Some adhesive is invariably deposited into the void areas of the resist, and subsequently, in the blasting process, this layer of adhesive will slightly impede the blast and leave a surface defect on the etched area of the object. Alternatively, some of the mask areas can also be missed completely or can be given too little adhesive coating. This can result in blow offs of a portion or all of the photoresist during blasting which will ruin an object.

Conventional photoresists for sandblasting are described in VanIseghem, U.S. Pat. No. 4,764,449, Goto et al., U.S. Pat. No. 4,430,416, and Nakamura et al., U.S. Pat. Nos. 4,456,680 and 4,587,186. These references generally discloses the use of photoresist masks which are formed as a photoresist mask laminate away from the target surface and which are then applied to the target surface using an adhesive. The adhesive is generally applied after the imaging and developing of the photoresist mask has been completed. The application of the adhesive is generally not described in any great detail, but is usually applied as described above with some contact-type adhesive applicator or by brushing or spraying.

To form an adherable photoresist, the laminate is exposed to light through a positive image plate. The plate is removed and the photosensitive area is developed to reveal a negative photoresist. A layer of adhesive may then be applied to the developed resist and the laminate comprising the membrane support layer, photoresist layer and adhesive layer is then applied to the surface to be etched or abraded. Careful adhesive application is required to ensure that the adhesive contacts only to the photoresist layer or the adhesive itself may in effect form a further photoresist mask.

Goto et al. discloses sandblast resists which have a minimal tack or adhesion to a target surface. These resists are therefore coated with an additional adhesive to firmly anchor the resist onto the target surface. This reference indicates that the adhesive layer is applied by brush or spray after the resist is formed.

The Nakamura references are directed to photoresist masks for sandblasting comprising a support film layer, a retainer film layer of a water insoluble cellulose derivative and an adhesive, photoresist layer of a pattern mask. The mask is prepared from a liquid photopolymerizable composition layer which is exposed in a pattern using a positive image. Upon exposure and development, the liquid photopolymerizable composition photohardens to form an adhesive photoresist layer. This technology is of limited usefulness as the pre-exposed photosensitive laminate comprises a liquid layer which must be handled with care. Therefore, the exposed photosensitive laminate cannot be shipped for use and exposure by shops or users other than a producer of the laminate itself. Thus, small custom manufacturers of photoresists and do-it-yourselfers are effectively precluded from using this self-adhesive photoresist.

Photoresists are commonly used and valuable industrial materials. Their introduction has greatly reduced processing costs and labor required to form chemically etched and physically abraded surface patterns in articles such as glassware, grave stones, and other decorated surfaces. However, the photoresists and processes for forming these photoresists thus far developed have been of limited versatility. Pre-formed and developed photoresists are often fragile in their unexposed and undeveloped state are formed using complex processes, or require separate, expensive adhesive applicators. These developed photoresists are typically used in-house and are not designed for sale to small users and do-it-yourselfers. The capital expenses required to enable one to form these photoresists effectively prevent their manufacture by these end-users.

Therefore, a versatile, photoresist film laminate which can be mass produced and sold as a pre-exposed and developed photoresist or which can be sold in unexposed and undeveloped form to custom manufacturers and do-it-yourselfers is needed. Characteristics which are helpful to form such a versatile photoresist laminate include a photoimageable, pressure sensitive adhesive layer to provide the adhesive only on the desired areas of the photoresist.

SUMMARY OF THE INVENTION

We have found that a photoresist mask material can be substantially improved by coupling a photoimageable pressure sensitive adhesive film layer with a photoimageable mask forming layer. This allows the use of a more durable mask layer in conjunction with a softer, tacky pressure sensitive adhesive layer formulation. Separating the resist and adhesive layers, each layer can be optimized without sacrificing effectiveness to provide two different photoimageable functions. The resist layer can be loaded with materials which yield a very durable and tough mask and forms very detailed images, while the adhesive layer can be formulated to provide a softer, highly tacky photoimageable layer to give approved image detail.

The improved sandblast mask laminate includes at least a structural support layer, a photoimageable masking layer, and a photoimageable, pressure sensitive adhesive layer. Each of these layers are held in substantially co-extensive content. In a preferred embodiment, the photoimageable masking layer is disposed between the pressure sensitive adhesive layer and the structural support layer. The sandblast mask material can be manufactured and stored or transported in an unimaged form.

BRIEF DESCRIPTION OF THE DRAWING

FIG. 1 is a cross-sectional view of a photoimageable sandblast laminate before exposure and development.

FIG. 2 is a cross-sectional view of the laminate of FIG. 1 after selective exposure and development.

DETAILED DESCRIPTION OF THE INVENTION

Photoimageable Pressure Sensitive Adhesive Layer 10

The photoimageable, pressure sensitive adhesive layer of the present invention generally comprises both the photopolymer resins and pressure sensitive adhesive resins.

The photosensitive composition can be either a negative acting composition or positive acting composition. Negative acting compositions typically are transformed from a soluble to an insoluble state upon exposure to light of a particular wavelength. Positive photosensitive compositions are transformed from an insoluble state to a soluble state when exposed to light. Typically, these photosensitive compositions are activated by light in the ultraviolet and visible ranges, e.g., 250 to 600 nm.

Photosensitive compositions which are used in photoresist manufacture typically may comprise reactive monomeric and/or polymeric substances along with photoactivated initiators. The photosensitive component may also be a self cross-linking photopolymer. The preferred photosensitive compositions are negative acting compositions. Therefore, the material in the photosensitive layer can polymerize or cross-link upon exposure to a sufficient intensity or quantity of electromagnetic radiation of the proper wavelength. Exposure can then activate free radical polymerization of the monomer or monomers contained within the photosensitive layer, or activate self cross-linking or cross-linking catalysts, agents, initiators or mixtures thereof for photosensitive polymers. Again, in the negative acting photosensitive systems, exposure of the composition to light of the proper wavelength initiates photohardening which may be a cross-linking or photopolymerization of the photosensitive component. This photohardening generally renders the polymeric mass insoluble or nondispersible in water or other solvents. However, those areas which are not photohardened typically remain water soluble or water dispersible. Thus, in preparation of a photoresist, the photosensitive film can be exposed to light which initiates a photohardening within the photosensitive component layer. This photohardening creates a latent image within the photosensitive layer. This latent may or may not be visible to the naked eye. The latent image can then be developed by washing the photosensitive layer with water or another suitable solvent to remove the non-photohardened areas in the polymer film. Thus, a photoresist can be formed.

Prior to photoimaging and developing, the photosensitive adhesive layer of the mask laminate exhibits dry tack and cohesion sufficient to maintain dimensional stability and to form a dry film layer in the laminate. After photoimaging and developing, the photoimageable layer of the present sandblast mask laminate exhibits pressure sensitive adhesive qualities or dry tack and adhesion sufficient to maintain adhesion to a target surface to withstand sandblasting abrasion processes, sufficient ductility and flexibility to withstand physical abuse in handling an application to the surface. To achieve these goals, the photoimageable, pressure sensitive layer of the laminate preferably comprises a photosensitive component, a binding resin, a tack imparting composition and optionally, a photoinitiator or photocrosslinker, plasticizer, a tackifier, a filler, and antioxidant. Obviously, depending upon the particular photosensitive materials selected and its inherent properties, some of these materials may be reductant.

If the photosensitive mass includes a monomer or polymer and photoinitiator, cross-linker couple, the photoinitiator or photocross-linker used in the photoimageable adhesive layer should be tailored to the particular photoimageable material selected. These couplings are well known in the art. A representative, non-limiting list of possible photoinitiators includes anthraquinone, benzophenone compounds, peroxides, diazo compounds, diazo resins, Ferris salts, etc. The photoinitiator may operate as a free radical initiator, a cross-linking agent, a cationic or acid initiated mechanism or by any other mechanism which is compatible with the objects of the invention.

These photoinitiators or cross-linkers can be used in conjunction with any monomer, monomeric mixture, polymer or polymeric mixture which exhibits photosensitivity in the presence of these photoinitiators or photocrosslinkers. A representative, nonlimiting list of such materials include polyvinyl alcohol, polyvinyl seminate, carboxymethyl cellulose, polyvinyl prylodone, gelatin, starch and others; acrylate/urethane based monomers and oligomers; and other commonly used monomers and oligomers used in ultraviolet and electron beam curing technology.

Photopolymers which are self cross-linking are also useful. These photopolymers include the class of photosensitive compounds based on photoinitiated dimerization involving a styryl pendant group, e.g. styryl pyridine. Early work with this class of photopolymers was performed by Douglas G. Borden, Jack L. R. Williams and others at Eastman Kodak, and it is disclosed in detail in Leubner et al., U.S. Pat. No. 2,811,510; and Williams, U.S. Pat. No. 2,908,667. Additional work in this area was performed by K. Ichimura and others at the Japanese Research Institute for Polymers and Textiles and is disclosed in detail in Ichimura, et al., U.S. Pat. No. 4,777,144 (1988); U.S. Pat. No. 4,564,580 (1986); European Patent No. 130 804 (1984); Japanese Patent No. 63/198045 (1988). All of these references are herein incorporated by reference. Both the Kodak and Ichimura technology generally cross-link through similar mechanisms. Any monomer, monomeric mixture, polymer or polymeric mixture which exhibits the properties discussed above may be used in the photosensitive adhesive layer of the present invention. Preferably, the photosensitive composition is based on photopolymers having pendant styryl groups such as the Kodak and Ichimura technology.

A particularly preferred photopolymer is a polyvinyl alcohol acetalized with N-methyl-4-(-p-formyl styryl) pyridinium methosulfate, available from Charkit Chemical Corporation under the trademark SPP. This photopolymer is supplied in an aqueous solution and has a degree of polymerization of about 300–3,000, a degree of saponification of about 60–100, a pendant styryl group content of less than about 7.5 mole %, and a solids content of less than about 25 wt %.

The photoimageable pressure sensitive adhesive layer also includes a tack imparting composition. Any tack imparting composition which is compatible with the photoimageable material selected, i.e., which does not interfere significantly with the photoimaging and photohardening of the polymeric material may be used in the photosensitive, adhesive layer or film. The tack imparting composition may be a tackifier or a pressure sensitive adhesive (PSA). A representative, non-limiting list of tackifiers includes natural rosins, polyterpene resins, phenolic-modified cuomarene-indene resins, ester gum, gum rosin, hydrogenated rosin, hydrocarbon resins, etc. A representative, non-limiting of PSA includes those based on natural rubbers, styrene-butadiene rubbers, acrylates, silicones, vinyl acetate copolymers, etc. The tack imparting composition should be removable in the developer, and preferably, the tack imparting composition is water dispersible. For example, many tackifiers are emulsifiable in aqueous systems using polyvinyl alcohol. Preferably, the tack imparting composition is a PSA. Generally, this PSA will be compounded with minor amounts of tackifiers and/or plasticizers. Preferred PSA's include ethylenevinyl acetate and polyvinyl acetate based PSA's.

Any plasticizer which is compatible with the photoimageable material selected, i.e., which does not interfere significantly with the photoimaging and photohardening of the polymeric material may be used in the photosensitive, adhesive layer or film. A representative, non-limiting of such materials includes phthalates benzoates, phosphates, adipates, sebacate esters, polyols such as ethylene glycol and its derivatives, etc. The plasticizer should be removable in the developer, and preferably, the is water dispersible.

Any binding resin which is compatible with the photoimageable material selected, i.e., which does not interfere significantly with the photoimaging and photohardening of the polymeric material may be used in the photosensitive, adhesive layer or film. A representative, non-limiting of such materials includes polyvinyl acetate, a polyethylene-vinyl acetate copolymer, ethyl cellulose, and cellulose acetate. The binding resin should be removable in the developer, and preferably, the binding resin is water dispersible.

The filler, antioxidant, and dye or pigment optionally used in the invention should not interfere significantly with the photoimaging and photohardening of the polymeric material may be used in the photosensitive, adhesive layer or film. Many such materials are known to those of ordinary skill in the art.

For reasons of cost, improved water solubility, film properties and photocross-linking efficiency, it is preferred that the photoimageable polymeric resin comprise polyvinyl alcohol accetalized with styryl pendant group. More preferably, the photosensitive polymer of the invention operates in conjunction with a binder resin, e.g., a combination of the acetalized polyvinyl alcohol and polyvinyl acetate. Further, it is preferred that the photosensitive, adhesive layer comprises about 10 to 50 wt % photocross-linkable polymer and about 5 to 30 wt % binder resin. If too much of the photosensitive component is used, loss of tack occurs, on the other hand, if too little of the photosensitive component is present, insufficient photocross-linking occurs.

Reference to the following Table may more clearly describe the composition of my invention:

TABLE

|  | Useful | Preferred | More Preferred |
| --- | --- | --- | --- |
| Photoimageable resin | 10–50 | 20–40 | 15–30 |
| Photoinitiator | 0–5 | 0–4 | 0–3 |
| Binder resin | 5–30 | 10–25 | 20 |
| Tack imparting composition | 30–60 | 40–50 | 45 |

The above Table is merely offered to guide the practitioner in formulating photoimageable, adhesive film layers. Indeed, the practitioner may decide that it is advantageous to operate in a "Useful" range for one component while operating in a "More Preferred" range for another.

Photoimageable Mask Layer

The photoimageable masking layer of the present invention generally includes a photoimageable component and a binder resin, and optionally, tackifiers, plasticizers, fillers, antioxidants, etc. These components may generally be as discussed above relating to the photoimageable adhesive layer. Preferably, the components used the two photoimageable layers (the adhesive layer and the masking layer) are compatible, and more preferably, the two layers included some of the same components. These components can be combined with the following ratios:

TABLE

|  | Useful | Preferred | More Preferred |
| --- | --- | --- | --- |
| Photoimageable resin | 0–50 | 10–40 | 15–30 |
| Photoinitiator | 0–5 | 0–4 | 0–3 |
| Binder resin | 50–80 | 60–70 | 65 |
| Plasticizers | 0–15 | 5–10 | 7–9 |

Again, the above Table is merely offered to guide the practitioner in formulating photoimageable, adhesive film layers. Indeed, the practitioner may decide that it is advantageous to operate in a "Useful" range for one component while operating in a "More Preferred" range for another.

Structural Support Layer

A support layer is helpful provides a film to which the photohardened and developed photoresist may adhere during removal from the surface of the photoresist of release liners. Thus, the support layer again helps the photoresist remain structurally intact and dimensionally correct. Further, the support membrane can provide protection from mishandling of the photoresist prior to sandblasting or etching. Finally, the support layer helps to reduce over-washing of fine, detailed areas of the photoresist mask during development.

After application of the photoresist to the surface to be abraded or etched, the support layer is typically retained on the side of the photoresist opposite the surface to be decorated. The support layer may be selected so that it is easily destroyed by an etching composition or sandblasting so it does not interfere with the ultimate performance of the photoresist.

Any polymeric resinous material or metallic film may be used as the support layer if it exhibits the above characteristics. It is preferred that the support membrane be about 1 to 5 microns in thickness. This thickness along with the material's toughness, chemical resistance, etc. provides a sufficient base for stripping the carrier layer, while not providing too great an impediment to the chemical etch or physical abrasion of the surface to be decorated. A representative, non-limiting list of useful support membrane materials includes metallic films such as copper, aluminum and polymeric materials such as polyvinyl butyral, poly(vinyl formal), polyethylene/vinyl acetate copolymers, polyolefins, nitrocellulose, and PVC and other materials such as paper.

Carrier and Protective Layers

The mask laminate of the present invention preferably also includes a carrier layer which is strippable from and adjacent to the support layer and a removable protectable layer adjacent to the pressure sensitive layer to render the laminate non-tacky during handling and processing. The carrier layer should contact the support membrane with the surface having relatively low surface energy to render it strippable or peelable from the support membrane. This can be achieved by coating a film with a thin layer of a release agent or release liner such silicone, electron beam cured release coating, polytetrafluoroethylene (PTFE), or a UV curable release coating. The carrier film can also be a matter film. The surface of these films has a much lower surface energy which allows them to be stripped from the support layer. Preferably, the release liner comprises a polyolefin film such as polypropylene or polyethylene or a polyester film such as polyethylenetetrathalate (PET) or a MYLAR film.

The removal protective layer may be a release coated film as described above for the carrier film or it may be a water removal coating which is applied after the mask laminate has been photoimaged and developed. This water removal coating may be starched based, polymeric, such as a polyvinyl alcohol, carboxymethyl, cellulose, polyvinyl pyridine, polyethylene oxide, or water dispersible or soluble polymer.

DETAILED DESCRIPTION OF THE DRAWING

Referring now to FIG. 1, the laminate 10 may take the form of a multi-layer construction having a first carrier layer 11, a second structural support layer 12, a third photosensitive, photoimageable masking layer 14, a fourth photoimageable pressure sensitive adhesive layer 16, and fifth protective coating layer 18.

In the construction of FIG. 1, the laminate can be contacted with an imaged film and exposed to radiation to alter the photoimageable layers 14 and 16. The laminate 10 can then be developed in aqueous solution to remove the areas which have been exposed to radiation in a positive acting resist or those which have not been exposed in a negative resist construction (void areas 20 in FIG. 2). After exposure, the adhesive layer 16 can again be covered with a protective layer 18a, or it can be directly applied to a target substrate (not shown) for subsequent abrasion processing. If the laminate 10 is applied to a target substrate, the carrier film layer 11 may then be removed from the support layer 12. The mask and target surface can then be subjected to particulate abrasion in an air stream such as a sandblasting process. The particulate abrasion will penetrate, destroy and remove the structural support layer 12 across the void areas 20 of the sandblast mask 10. The sandblast abrasive action then continues to etch the target substrate exposed by the void areas 20 of the sandblast mask 10. After the abrasion process has been completed, the sandblast mask 10 can be removed from the target surface by peeling, scrapping, treating with an appropriate solvent, soaking in water, etc.

The invention is further described below by resort to several examples describing various aspects of the present invention, and preparation and use of the sandblast mask laminate.

EXAMPLES

The following specific examples which contain the best mode, can be used to further illustrate the invention. These examples are merely illustrative of the invention and do not limit its scope.

The mixture was made by weighing each of the ingredients into a mixing vat. The components were mixed using an overhead mixing system with a standard propeller. The resulting mix had a viscosity of about 22,000 cP at 21° C. as measured by Brookfield Viscometer model #RVT.

EXAMPLE 1

The following ingredients were combined in a mixer in the identified proportions:

| Component | Wt.-% |
| --- | --- |
| Polyvinyl alcohol (VINOL 205 solution) | 19.0 |
| Defoaming Agent (BALAB WITCO 3056A) | 0.2 |
| Dye (Keamine Violet KB 200%) | 0.04 |
| Polyvinyl acetate emulsion (XR2223 H.B. Fuller Co.) | 65.0 |
| Plasticizer (Benzoflex 50) | 8.0 |
| Surfactant (FLUORAD FC-171, 3M Company) | 0.3 |
| Photosensitizer (diazo resin) | 0.4 |
| Water | 6.0 |

The mixture was made by weighing each of the ingredients into a mixing vat. The components were mixed using an overhead mixing system with a standard propel. The resulting mix had a viscosity of 2,000 cP at 21%.

EXAMPLE 2

The following ingredients were combined in a mixer as in Example 1 in the identified proportions:

| | Wt-% |
| --- | --- |
| SBQ SPPH 13 | 19 |
| United Adh. XR50-1224 | 35 |
| PVAC XR2223 | 24 |
| Benzoflex 50 | 3 |
| FC-171 | 0.3 |
| Pure Water | 10 |
| Glycerol | 9 |
| RL-130 | 0.1 |

The resulting mixture exhibited good film-forming and adhesive properties and was photoimageable.

EXAMPLE 3

The following ingredients were combined in a mixer in the identified proportions:

| | Wt-% |
| --- | --- |
| SPPH13 | 20 |
| BALAB 3056A | 0.2 |
| KEYAMINE-VIOLET KB 200% | 0.04 |

-continued

|  | Wt-% |
|---|---|
| PURE WATER | 6 |
| PVAC XR 2223 | 65 |
| BENZOFLEX 50 | 8 |
| FL-171 | 0.3 |

The resulting mixture exhibited good film-forming properties and was photoimageable.

The foregoing description, examples and data are illustrative of the invention described herein, and they should not be used to unduly limit the scope of the invention or the claims. Since many embodiments and variations can be made while remaining within the spirit and the scope of the invention, the invention resides wholly in the claims hereinafter appended.

What is claimed is:

1. A sandblast mask material comprising a laminate suitable for dry application to a surface for decorative treatment of the surface by particulate abrasion, the laminate comprising:
   (a) a pressure sensitive adhesive layer comprising an effective amount of a photopolymer having pendant, photocross-linkable, styryl groups to render the pressure sensitive adhesive layer photoimageable; and
   (b) a photoimageable masking layer comprising about 15 to 50 wt % of a photopolymer having pendant, photocross-linkable, styryl groups, about 50 to 80 wt % of a binder resin, and about 0 to 15 wt % of a compatible plasticizer;
wherein each layer is held in substantially coextensive contact, the laminate is imageable before application to a target substrate, and the laminate is applicable to the target substrate as a pressure sensitive masking laminate.

2. The laminate of claim 1 wherein the photopolymer in the pressure sensitive adhesive layer has pendant groups derived from styrylpyridine.

3. The laminate of claim 1 wherein the pressure sensitive adhesive layer comprises about 30 to 60 wt % of a pressure sensitive adhesive composition based on a polymeric resin selected from the group consisting of polyvinyl acetate, ethylene-vinlyacetate copolymers, acrylics, and styrene-butadiene copolymers and natural rubbers.

4. The laminate of claim 1 wherein the pressure sensitive adhesive layer transmits image-producing light without appreciable light scattering, allowing the production of a high-resolution, photoresist masking laminate.

5. The laminate of claim 1 wherein the photopolymer in the masking layer has pendant groups derived from styrylpyridine.

6. The laminate of claim 1 wherein the pressure sensitive adhesive layer comprises about 5 to 30 wt % of a binder resin.

7. The laminate of claim 1 which further comprises a support layer.

8. The laminate of claim 7 wherein the support layer is a polymeric film.

9. The laminate of claim 8 wherein the polymeric film is selected from the group consisting of polyethylene and polyethylene terephthalate films.

10. The laminate of claim 7 wherein the masking layer is disposed between the pressure sensitive adhesive layer and the support layer.

11. The laminate of claim 7 which further comprises a carrier layer which is strippable from and adjacent to the support layer.

12. The laminate of claim 1 which further comprises a removable protective layer adjacent the pressure sensitive adhesive layer.

13. The laminate of claim 12 wherein the removable protective layer is a release lined sheet.

14. The laminate of claim 12 wherein the removable protective layer is a water soluble coating which is removable by an aqueous developing solution for the photoimageable masking and adhesive layers.

15. A sandblast mask laminate comprising:
   (a) a pressure sensitive adhesive layer comprising an effective amount of a photopolymer having about 1 to 7.5 mol % pendant photocross-linkable groups derived from styrylpyridine to render the pressure sensitive adhesive layer is photoimageable, wherein the pressure sensitive adhesive layer transmits image-producing radiation through it without appreciable radiation scattering, allowing the production of a high-resolution, photoresist masking laminate;
   (b) a photoimageable masking layer comprising about 15 to 50 wt % of a photopolymer having pendant, photocross-linkable, styryl groups about 50 to 80 wt % of a binder resin, and about 0 to 15 wt % of a compatible plasticizer;
   (c) a structural support film, wherein the masking layer is disposed between the pressure sensitive adhesive layer and the support film;
   (d) a carrier layer strippable from and adjacent to the support layer; and
   (e) a removable protective layer adjacent to the pressure sensitive adhesive layer;
wherein each layer is held in substantially coextensive contact, the laminate is imageable before application to a target substrate, and the laminate is applicable to the target substrate as a pressure sensitive masking laminate.

16. The laminate of claim 15 wherein the pressure sensitive adhesive layer comprises about 30 to 60 wt % of a pressure sensitive adhesive composition based on a polymeric resin selected from the group consisting of polyvinyl acetate, ethylene-vinlyacetate copolymers, acrylics, and styrene-butadiene copolymers and natural rubbers.

17. The laminate of claim 15 wherein the support layer is a polymeric film.

18. The laminate of claim 17 wherein the polymeric film is selected from the group consisting of polyethylene and polyethylene terephthalate films.

19. The laminate of claim 15 wherein the pressure sensitive adhesive layer comprises about 5 to 30 wt % of a binder resin.

* * * * *

UNITED STATES PATENT AND TRADEMARK OFFICE
CERTIFICATE OF CORRECTION

PATENT NO. : 5,415,971

DATED : May 16, 1995

INVENTOR(S) : Couture et al.

It is certified that error appears in the above-identified patent and that said Letters Patent is hereby corrected as shown below:

On Column 4, line 26 "prylodone" should read --pyrrolidone--

Col. 4, line 45 and 46 delete "European Patent No. 130/804 (1984): Japanese Patent No. 63/198045 (1988)" after the date "(1986):"

On Column 7, line 22 insert --as-- after the word "such"

On Column 7, line 29 "polyethylenetetrathalate" should read --polyethylenetetraphthalate--

Signed and Sealed this

Twenty-third Day of April, 1996

Attest:

BRUCE LEHMAN

Attesting Officer    Commissioner of Patents and Trademarks